Feb. 6, 1973 J. H. BREDT ET AL 3,715,241
DOPED TIN TELLURIDE BRAZING MATERIAL FOR SEMICONDUCTIVE THERMOELECTRIC GENERATOR ELEMENTS
Filed Oct. 10, 1968
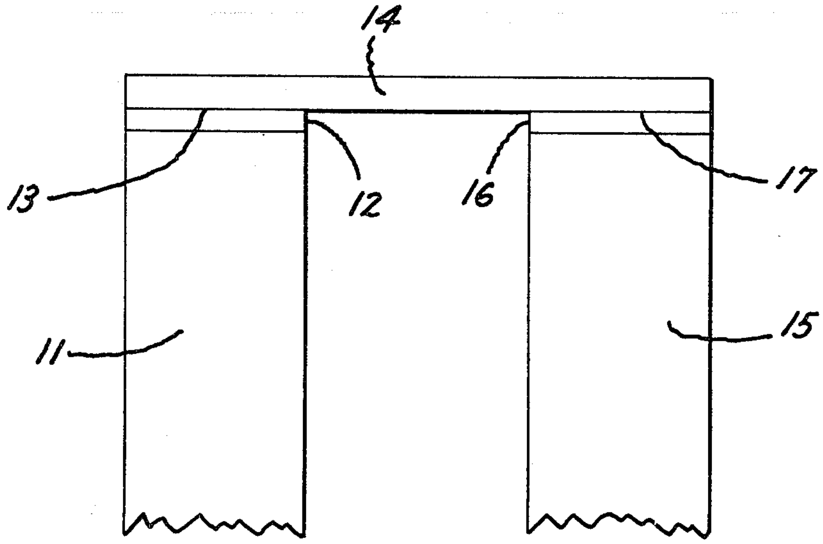
Inventors:
James H. Bredt,
Louis F. Kendall, Jr.,
by [signature]
Their Attorney.

United States Patent Office 3,715,241
Patented Feb. 6, 1973

3,715,241
DOPED TIN TELLURIDE BRAZING MATERIAL FOR SEMICONDUCTIVE THERMOELECTRIC GENERATOR ELEMENTS

James H. Bredt, Garrett Park, Md., and Louis F. Kendall, Jr., Scotia, N.Y., assignors to General Electric Company, Schenectady, N.Y.

Filed Oct. 10, 1968, Ser. No. 766,634
Int. Cl. H01v *1/04*
U.S. Cl. 136—237 5 Claims

ABSTRACT OF THE DISCLOSURE

It has been found that when semiconductive lead telluride thermoelectric generator elements are brazed to iron clad stainless steel bridging members by stoichiometric tin telluride, there was a gradual degradation of the electrical properties during the life of the generator. It is believed that this is the result of migration of the doping elements from the lead telluride into the tin telluride by solid state diffusion. Therefore, p-type lead telluride has been brazed with sodium doped tin telluride and n-type lead telluride has been brazed with iodine doped tin telluride.

This invention relates to the thermoelectric generation of power and particularly to the improved fabrication of generator elements comprising semiconductive lead telluride. Cross-reference is hereby made to Ser. No. 760,989, filed Sept. 19, 1968 which is a continuation-in-part of Ser. No. 575,244, filed Aug. 26, 1966 (now abandoned), both filed in the names of the present inventors and assigned to the same assignee, and disclose related subject matter, said disclosures being incorporated by reference herein.

Lead telluride thermocouples for the direct conversion of heat energy to electric energy have been known for some time. Superficially, these thermocouples operate in the same manner as earlier developed "metal" thermocouples, such as Chromel-Alumel, iron-constantan, and platinum-platinum rhodium, for example. In detail, however, the lead telluride thermocouple is quite different from the metal thermocouples in that it is a semiconductive device and has a thermoelectric heat conversion efficiency of up to ten times that of the metal thermocouples. For a more detailed discussion of these semiconductive thermocouples see "Direct Conversion of Heat to Electricity," edited by Kay and Welch, John Wiley and Sons, Inc., New York, 1960, chapter 16, p. 16–5.

In general, these thermocouples have been made by establishing an electrical connection between a p-type lead telluride semiconductor body and n-type lead telluride semiconductor body by means of a conductive metallic bridging element. Usually, the two lead telluride bodies are arranged in spaced relationship in contact with one side of a plate-like body of the metal bridging element which functions to establish an electrically conductive path between the two lead telluride bodies and as a heat transfer medium. This three-piece assembly constitutes the hot junction of the thermocouple. The ends of the lead telluride bodies remote from the bridging member are each connected to a conductor for connection to the circuit or electrical device utilizing the generated power. Obviously, a plurality of such hot junctions may utilize heat from a common source and their individual outputs may be connected in series or parallel into a common circuit, if desired.

As disclosed in greater detail in the previously referenced co-pending application, it is desirable to provide a reliable low resistance electrical contact between the lead telluride elements and the bridging member which has a face portion which forms the electrical contacts with the lead telluride thermoelements. The use of tin telluride as a brazing material between the bridging member and the ends of the lead telluride members forms such a low resistance joint, and if a small but effective amount of antimony is employed in the braze, as taught by Pat. No. 3,382,109, the joint has improved resistance to mechanical failure during thermal cycling. The use of Type 300 series stainless steels for the bridging member is desirable for use in thermocouples where thermal cycling is to be encountered in service because its coefficient of thermal expansion more nearly matches that of lead telluride than other ferrous alloys. However, steps must be taken to prevent undesirable diffusion from the stainless steel into the lead telluride through the brazed joint. Several solutions for this problem are disclosed in the previously referenced application.

Using the previously described brazing techniques, specifically brazing n and p type lead thermoelements to iron-clad Type 302 and 304 stainless steel bridging members, junction resistivities of $25\times10^{-6}$ ohm-cm.$^2$ or less can readily be obtained. During operation at hot junction temperatures of about 600° C., however, this initially low resistivity begins to degrade and may become as high as $200\times10^{-6}$ ohm-cm.$^2$ or higher with an attendant degradation of thermoelectric efficiency.

It would therefore be desirable to stabilize these brazed thermocouples to prevent or substantially decrease the rate of degradation and such is a principal object of this invention.

Briefly stated and in accordance with one aspect of the invention, it was conceived that this degradation of electrical properties is significantly related to the relatively large concentration gradient of the dopant materials across the brazing material-lead telluride interfaces. As is well known, the p-type lead tellurides contain a small but effective amount of a metallic dopant such as, for example, sodium, while the n-type lead telluride is doped with a small but effective amount of a non-metallic dopant such as, for example, iodine. During operation, significant diffusion of the dopant, such as sodium and iodine, across the brazing material-lead telluride interface causes a depletion of the dopant from the lead telluride elements which results in a progressive degradation of the electrical properties thereof. The rate at which such diffusion may take place is a function of the concentration gradient across the interface. If the tin telluride brazing material is doped with the same dopant as the lead telluride element with which it is in contact with in an amount sufficient to reduce or eliminate the concentration gradient, degradation due to depletion of the dopant from the lead telluride thermoelement will be avoided.

BRIEF DESCRIPTION OF THE DRAWING

The figure is a cross-sectional view of a thermoelectric device according to the invention.

The figure illustrates a three-piece assembly constituting a thermocouple hot junction according to the invention. A small p-type semiconductive lead telluride member 11 is secured by a brazed joint 12 at a first zone 13 of a contact member 14, and a n-type semiconductive lead telluride member 15 is secured by a brazed joint 16 at a second zone 17 to the contact member, the zones 13 and 17 being spaced apart as shown.

In accordance therewith, p-type lead telluride elements which had been doped with sodium and having an approximate composition of $PbNa_{0.005}Te_{1.005}$ were brazed to iron-clad Type 3 stainless steel bridging elements with tin telluride brazing material wihch had been doped with sodium having an approximate composition of $$Sn_{1.005}Na_{0.005}Te_{1.005}$$

and iodine doped n-type lead telluride having an approximate composition of $Pb_{1.0010}I_{0.0010}Te$ was brazed to a similar bridging element with tin telluride brazing material having an approximate composition of $Sn_{1.01}I_{0.01}Te$.

The initial resistivities of the p-type junctions were 33, 16, 15 and 12 micro ohm-cm.$^2$ and for the n-type junction $22 \times 10^{-6}$ ohm-cm.$^{-2}$. These legs exhibited greater electrical stability during operation at temperature than the undoped tin telluride brazed junction.

While any effective amount of dopant in the brazing material will accomplish the desired result, i.e. lowering the degradation rate of the lead telluride, a concentration of the dopant in the brazing material which is substantially the same or slightly greater than the dopant level in the lead telluride element to be brazed is to be preferred. This invention is applicable to lead telluride compositions represented by the formulae:

(a) $Pb_{(1+x)}I_yTe$ where $x$ and $y$ are finite numbers between about 0.00030 and about 0.00100, and
(b) $PbTe+x(Na_yTe)$ where $x$ and $y$ are finite numbers between about 0.001 and 0.01 for $x$ and from about 1.5 to 2.5 for $y$. The tin telluride brazing material may contain from about 0.2 to 10 times the amount of iodine in (a) above and from about 0.2 to 10 times the amount sodium in (b) above.

In view of the foregoing, it is not intended to restrict the scope of the invention to the specific examples disclosed but only to the invention defined by the following claims.

What we claim as new and desire to secure by Letters Patent of the United States is:

1. An article of manufacture comprising a p-type and an n-type semiconductive lead telluride element each containing a small but effective amount of a predetermined dopant selected from the group consisting of sodium iodine, a metallic contact member and brazed joints connecting a respective one of said lead telluride elements to said contact member, said brazed joints comprising tin telluride brazing material containing said predetermined dopant, said brazing material and said respective elements defining respective interfaces therebetween, said p-type element being brazed with a doped brazing material to a first zone of said contact member, said n-type semiconductive lead telluride element being brazed with a doped brazing material to a second zone of said contact member spaced apart from said first zone, the dopant in the brazing materials of each brazed joint and in the corresponding semiconductive lead telluride element across the interfaces therebetween being the same predetermined dopant, the dopant content throughout the brazing material and throughout the semiconductive element of a respective joint being the same and uniformly distributed.

2. An article as set forth in claim 1, said p-type lead telluride element being doped with sodium and having an approximate composition of $PbNa_{0.005}Te_{1.005}$, said tin telluride brazing material joining the metallic contacting member to said p-type element essentially containing sodium and having the approximate composition of $$Sn_{1.005}Na_{0.005}Te_{1.005}$$

3. An article as set forth in claim 1, said n-type lead telluride element being doped with iodine and having an approximate composition of $Pb_{1.0010}I_{0.0010}Te$, said tin telluride brazing material joining the metallic contact member to said n-type element essentially containing iodine and having an approximate composition of $Sn_{1.01}I_{0.01}Te$.

4. An article as set forth in claim 1 wherein said p-type lead telluride member has a composition corresponding to the formula $PbTe+x(Na_yTe)$ where $x$ and $y$ are finite numbers having values of from about 0.001 to 0.01 for $x$ and from about 1.5 to 2.5 for $y$, and the brazing material securing said p-type member to said contact member is tin telluride.

5. An article as set forth in claim 1 wherein said n-type lead telluride member has a composition corresponding to the formula $Pb_{(1+x)}I_xTe$ where $x$ and $y$ are finite numbers having values of from about 0.00030 to about 0.00100, and the brazing material securing said n-type member to said contact member is tin telluride.

References Cited

UNITED STATES PATENTS

| | | | |
|---|---|---|---|
| 2,890,260 | 6/1959 | Fredrick et al. | 136—237 X |
| 3,037,065 | 5/1962 | Hockings et al. | 136—237 |
| 3,050,684 | 8/1962 | Sclar | 136—237 X |
| 3,051,767 | 8/1962 | Frederick et al. | 136—205 X |
| 3,203,772 | 8/1965 | Intrater | 136—237 UX |
| 3,232,719 | 2/1966 | Ritchie | 136—237 X |
| 3,382,109 | 5/1968 | Kendall, Jr. et al. | 136—237 |

BENJAMIN R. PADGETT, Primary Examiner

H. E. BEHVERD, Assistant Examiner

U.S. Cl. X.R.

148—33.6; 317—234